(12) United States Patent
Koch

(10) Patent No.: US 9,477,789 B2
(45) Date of Patent: Oct. 25, 2016

(54) ROAD DESIGN OPTIMIZATION

(71) Applicant: Autodesk, Inc., San Rafael, CA (US)

(72) Inventor: Valentin R. Koch, Kelowna (CA)

(73) Assignee: Autodesk, Inc., San Rafael, CA (US)

( * ) Notice: Subject to any disclaimer, the term of this patent is extended or adjusted under 35 U.S.C. 154(b) by 579 days.

(21) Appl. No.: 13/626,451

(22) Filed: Sep. 25, 2012

(65) Prior Publication Data

US 2013/0080124 A1    Mar. 28, 2013

Related U.S. Application Data

(60) Provisional application No. 61/539,793, filed on Sep. 27, 2011.

(51) Int. Cl.
*G06F 7/60* (2006.01)
*G06F 17/10* (2006.01)
*G06F 17/50* (2006.01)

(52) U.S. Cl.
CPC ................. *G06F 17/5004* (2013.01)

(58) Field of Classification Search
CPC .................................. G06F 17/5004
See application file for complete search history.

(56) References Cited

U.S. PATENT DOCUMENTS

2002/0010569 A1* 1/2002 Yamamoto ............ 703/6
2008/0298891 A1* 12/2008 Boucherat et al. ........ 404/1

OTHER PUBLICATIONS

Kim, E., Jha, M. K., & Son, B. (2005). Improving the computational efficiency of highway alignment optimization models through a stepwise genetic algorithms approach. Transportation Research Part B: Methodological, 39(4), 339-360.*
Easa, S. M., & Wang, F. (2010). Estimating continuous highway vertical alignment using the least-squares method. Canadian Journal of Civil Engineering, 37(10), 1362-1370.*
Schonfeld, P., & Jong, J. C. (2006). Intelligent road design (vol. 19). WIT Press, 133-163.*
Goktepe, A. Burak, Selim Altun, and Perviz Ahmedzade. "Optimization of vertical alignment of highways utilizing discrete dynamic programming and weighted ground line." Turkish Journal of Engineering and Environ-mental Sciences 33.2 (2009): 105-116.*
A policy on geometric design of highways and streets: 2001. American Association of State Highway and Transportation Officials, pp. 235-282, 2001.
Kazuhiro Aruga, John Sessions, and Abdullah E. Akay. Heuristic planning techniques applied to forest road profiles. Journal of Forest Research, 10(2):83-92, 2005.
Deryl Burch. Estimating Excavation. Craftsman Book Company, 1st. edition, pp. 82-83, 1997.
E P Chew, C J Goh, and T F Fwa. Simultaneous optimization of horizontal and vertical alignments for highways. Transportation Research Part B: Methodological, 23(5):315-329, 1989.

(Continued)

*Primary Examiner* — Aniss Chad
(74) *Attorney, Agent, or Firm* — Gates & Cooper LLP

(57) ABSTRACT

A method, apparatus, system, article of manufacture, and computer readable storage medium provide the ability to optimize a design for a vertical road profile. A ground surface profile is obtained. From the ground surface profile, an initial set of points of vertical intersection (PVIs) are obtained. An optimized earthwork cost for the PVIs is determined. The PVIs and curve configurations are then modified to reduce the earth work cost.

22 Claims, 8 Drawing Sheets

(56) References Cited

OTHER PUBLICATIONS

David H Douglas and Thomas K Peucker. Algorithms for the reduction of the number of points required to represent a digitized line or its caricature. Cartographica: The International Journal for Geographic Information and Geovisualization, 10(2):112-122, 1973.

Said M Easa. Selection of roadway grades that minimize earthwork cost using linear programming. Transportation Research. Part A: general, 22(2):121-136, 1988.

Konrad Ebisch. A correction to the Douglas-Peucker line generalization algorithm. Computers & Geosciences, 28(8):995-997, 2002.

Nicolas Hansen. The CMA evolution strategy: a comparing review, StudFuzz 192, 75-102 (2006).

N Hansen and A Ostermeier. Completely derandomized self-adaptation in evolution strategies. Evolutionary Computing, 9(2):159-195, 2001.

J Jong and P Schonfeld. An evolutionary model for simultaneously optimizing three-dimensional highway alignments. Transportation Research Part B: Methodological, 37(2):107-128, Feb. 2003.

Valentin R Koch and Yves Lucet. A note on: Spline technique for modeling roadway profile to minimize earthwork cost. Journal of Industrial and Management Optimization, 6(2):393-400, May 2010.

Jon Kleinberg and Eva Tardos. Algorithm Design. Pearson Education, Inc., 1st. edition, pp. 261-266, 2006.

Yusin Lee and Juey-Fu Cheng. Optimizing highway grades to minimize cost and maintain traffic speed. Journal of Transportation Engineering, 127(4):303-310, Jul./Aug. 2001.

Yusin Lee, You-Ren Tsou, and Hsiao-Liang Liu. Optimization method for highway horizontal alignment design. Journal of Transportation Engineering, 135(4):217-224, Apr. 2009.

Ahmad A Moreb. Linear programming model for finding optimal roadway grades that minimize earthwork cost. European Journal of Operational Research, 93(1):148-154, Aug. 1996.

Ahmad A Moreb. Spline technique for modeling roadway profile to minimize earthwork cost. Journal of Industrial and Management Optimization, vol. 5 No. 2, pp. 275-283, May 2009.

D Trietsch. A family of methods for preliminary highway alignment. Transportation Science, 21(1):17-25, Feb. 1987.

* cited by examiner

ROAD DESIGN OPTIMIZATION

CROSS-REFERENCE TO RELATED APPLICATIONS

This application claims the benefit under 35 U.S.C. Section 119(e) of the following and commonly-assigned U.S. provisional patent application(s), which is/are incorporated by reference herein:

Provisional Application Ser. No. 61/539,793, filed on Sep. 27, 2011, by Valentin R. Koch, entitled "ROAD DESIGN OPTIMIZATION,".

BACKGROUND OF THE INVENTION

1. Field of the Invention

The present invention relates generally to computer-aided design (CAD) applications, and in particular, to a method, apparatus, and article of manufacture for optimizing road design in a CAD application.

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

Introduction

The geometric design of a road is a crucial part in any highway construction project. Once fixed, the design determines largely the construction costs. Multiple factors determine the construction cost of a road. In [CGF89], Chew et. al. divide construction costs in six major categories, pavement (25%), earthwork (25%, half of this is haul cost), bridges (20%), drainage (10%), miscellaneous items (10%), and land purchase (10%). From this, one may note that earthwork cost is a major cost component in the construction of roads.

The geometric design of a road is traditionally done in two stages: the horizontal alignment design and the vertical alignment design. The horizontal alignment is the road trajectory from a satellite's eye view. The horizontal alignment determines the overall length of the road, and therefore directly affects the pavement cost. Early attempts at horizontal alignment optimization were based on the technique of dynamic programming [Tri87]. More recent approaches use methods similar to genetic algorithms [JS03] or local neighborhood heuristics [LTL09].

For a given horizontal alignment, a vertical alignment, also called vertical road profile, is created with the goal to reduce earthwork cost. The vertical profile can be understood like a scatter plot, where the x-axis represents the distance from the beginning of the road, along the centerline. The y-axis represents the corresponding elevation values. Recorded points are connected by lines (slopes). This renders the road profile piecewise, whose pieces are these linear slopes, or grades of the road. The points that form the intersection of the grades are called the Points of Vertical Intersection (PVI). FIG. 1 illustrates a typical road profile and a corresponding mass diagram underneath, that represents the earthwork volumes. The dotted line on the top of FIG. 1 is the piecewise road profile (f(x)) that is illustrated along with the ground surface (g(x)). The black dots represent the PVIs. In order to provide a smooth ride, vertical curves are placed between the grades at each PVI.

Existing Methods for Design Optimization

An optimal vertical road profile with respect to earthwork cost, tries to follow the ground surface as close as possible. The closer the road is to the ground profile, the less earthwork needs to be done in order to cut or fill sections of the road. However, due to design constraints like grade changes, vertical curve length, etc., it is not always possible to follow the ground surface exactly.

Finding the road profile that minimizes the construction costs, subject to design constraints, is a process referred to as "profile design optimization."

Traditionally, the design of road profiles is done manually by engineers. In this approach, the vertical profile is evaluated with an integration of the earthwork volumes between the road profile and the ground surface. The integral can be plotted by hand or with the help of software. The plot of the integral is called a mass diagram, and is shown at the bottom of FIG. 1 as the cumulative mass:

$$h(x) = \int_0^x f(u) - g(u)\,du.$$

After visual inspection of the mass diagram, the engineer changes the profile and recomputes the volumes. This process is repeated until a satisfying solution is found. This common process therefore uses only the volumes of earth as a measure to quantify a profile.

Using the mass diagram, an experienced engineer is able to produce notably good designs. However, due to timely and budgetary constraints, a final alignment is often chosen from a small selection of possible solutions. Selecting the best of all possible designs can be framed as a multi-level mathematical optimization problem of operations research.

Since the 1980's, research has been done to automate the profile design optimization process with the help of computers. Methodologies and mathematical models were designed to solve the optimization problem. Most approaches to optimize the vertical profile use the mathematical method of linear programming (LP) to solve more or less sophisticated models [Eas88, Mor96, LC01, ASA05, Mor09, KL10]. In contrast to the volume measure approach in the mass diagram, these methods consider also the hauling costs of material. For a given set of PVI's, Easa presented a heuristic to select the elevation of the PVI's, and a LP that computes the earthwork cost for the selection [Eas88]. A similar approach using genetic methodologies and tabu search was shown by Aruga [ASA05]. More incorporated the selection of the elevation directly into the LP [Mor96], which was further developed in [Mor09, KL10]. Lee [LC01] presents a mixed integer linear programming approach that selects the best subset of a fixed set of potential PVI's.

All the prior art methods require the user to provide a fixed set of PVI's. Furthermore, none of the methods optimizes the exact location of the PVI's with respect to elevation and horizontal position. Also, the prior art fails to optimize the length of the vertical curves at each PVI. The methods in [Eas88, Mor96, ASA05, Mor09, KL10] optimize the elevation only and in [LC01], only the best subset of a given set of PVI's is chosen. The prior art methods in [Mor96, Mor09, KL10] use ground elevation information (a ground profile) only along the centerline. They do not support the use of additional ground profile offsets. Ground profile offsets are profiles of the existing ground, that are at an offset distance to the left and right of the original centerline ground profile (e.g. instead of just profiles with elevation points at the centerline, profiles for elevations on the road lanes, or sidewalks, or adjacent slopes may be included).

In view of the above, what is needed is a system and method that optimizes not only the exact location of the PVIs with respect to elevation and horizontal position but also optimizes the length of vertical curves at each PVI.

SUMMARY OF THE INVENTION

Embodiments of the invention present a new system and methodology for creating an optimized design of a vertical road profile with respect to earthwork costs. The vertical road profile is the vertical view of the road, with respect to the ground surface, between the starting point and the end point of the road. Optimal vertical road profiles, with respect to earthwork cost, try to follow the existing ground surface profile as close as possible.

As described above, existing scientific approaches to optimize such a road profile need pre-defined user input, such as existing road profiles, and/or a discrete set of fixed or potential Points of Vertical Intersection (PVI). The prior art methods then use either the fixed set or a selected subset of these PVI's and optimize the grades of the road via linear programming (LP) methods.

In embodiments of the invention, only the initial surface profile of the existing ground at the road centerline is needed as input. To increase the accuracy, a user may also provide ground surface profile offsets. In order to handle very large surface profiles, the invention may use the Douglas-Peucker method to reduce the number of ground points for the centerline. For the resulting ground points, the invention may then use a segmented least-squares methodology to create an initial set of PVI's. The invention optimizes the exact location of each PVI with respect to elevation and horizontal position along the profile. For that, the invention uses a continuous bi-level method. The invention may use a Stochastic Optimization methodology in the bi-level method. The user can provide a single surface profile only, or additional offset profiles, which render the solution more accurately. Furthermore, the bi-level method may use an LP model in a novel manner to handle multiple surfaces with different earthwork costs, and mixed materials for filling gaps.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.
Overview Embodiments of the invention present a new bi-level system/methodology, that, besides the ground surface profile at the centerline, needs no additional user input. An initial set of PVI's with vertical curves are generated and the position of each PVI is iteratively optimized with respect to elevation and horizontal position, as well as the vertical curve length. The user can provide additional ground surface profiles, that are at an offset from the centerline, in order to increase the accuracy of the solution.

In addition, embodiments of the invention provide a practical methodology for using multiple soil layers. In this regard, the LP method in [KL10] is extended with a non-trivial addition that handles multiple soil layers. The new extension allows for the use of mixed materials for fills, as well as the limitation of certain materials in such fills (e.g. it takes into account if a construction engineer requires that only a percentage of excavated material should be used in a fill).

Figure 1:
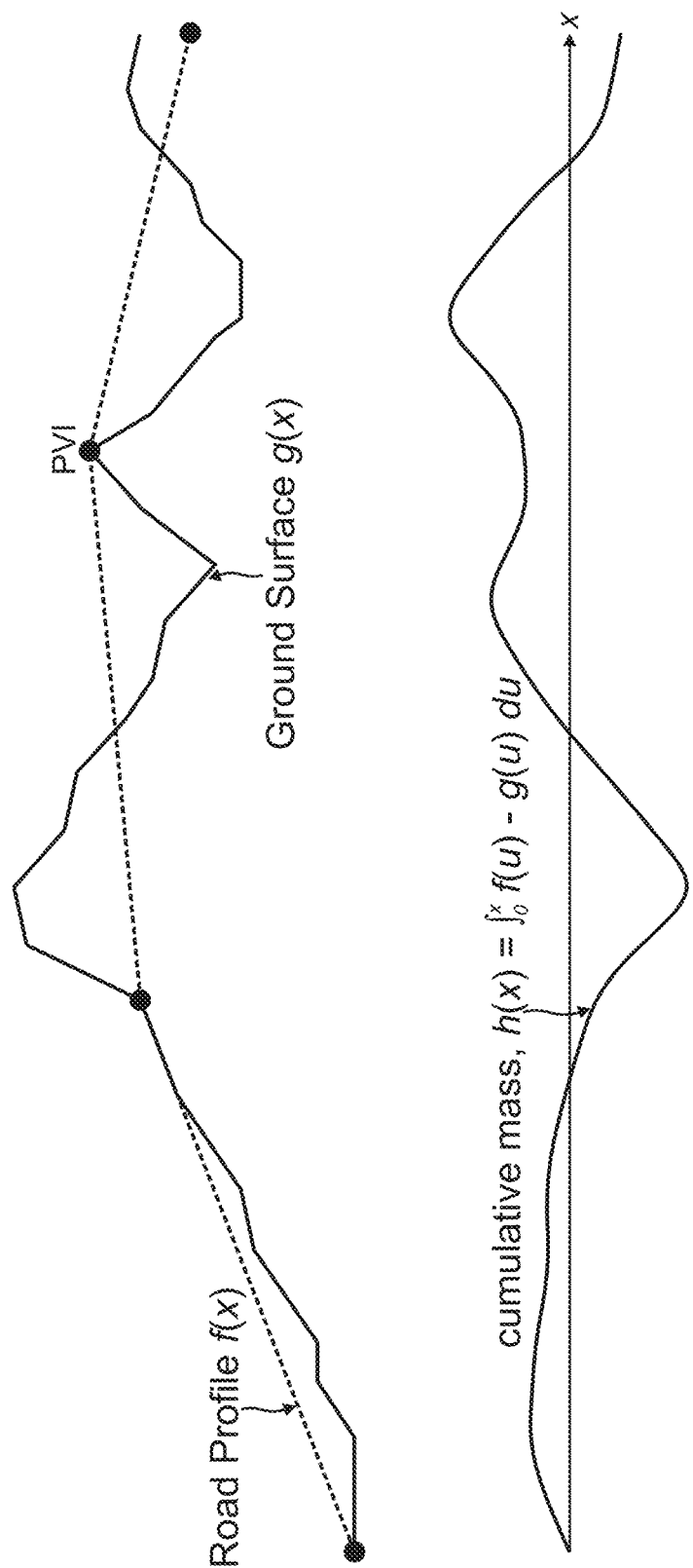
FIG. 1 illustrates a typical road profile and a corresponding mass diagram representing the earthwork volumes in accordance with one or more embodiments of the invention.
Figure 2:
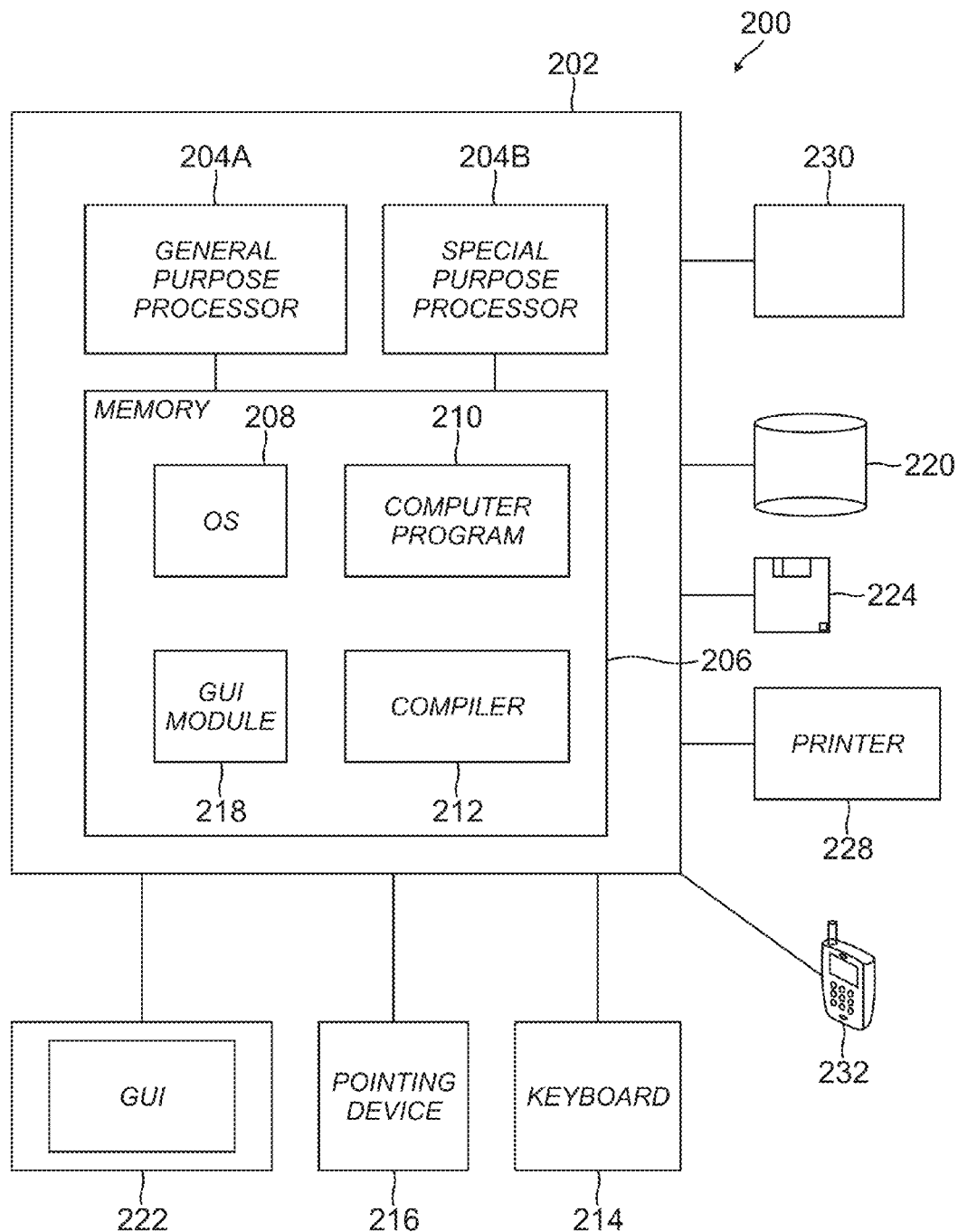
FIG. 2 is an exemplary hardware and software environment used to implement one or more embodiments of the invention.

Prior art methods using LP approaches divide the profile into earthwork sections to compute earthwork volumes. Hauling costs can then be calculated between these sections. However, all of the prior art approaches result in inaccurate earthwork estimation. Hence, the earthwork cost in a case where large amounts of excavation, and large amounts of embankment happen in the same section, is not reflected in the prior art. Furthermore, prior art approaches cannot be used to optimize the horizontal position of a PVI. For example, if two PVI's happen to be in the same section, the prior art optimization engine might come up with a solution that creates exactly the case mentioned before (i.e. large cuts and large fills are created in a section in order to cancel out). This creates very uneven roads. Embodiments of the invention add a new method to work with earth volumes between ground points. The new method eliminates the mentioned problems and allows for much more accurate volume computations.
Hardware Environment FIG. 2 is an exemplary hardware and software environment 200 used to implement one or more embodiments of the invention. The hardware and software environment includes a computer 202 and may include peripherals. Computer 202 may be a user/client computer, server computer, or may be a database computer. The computer 202 comprises a general purpose hardware processor 204A and/ or a special purpose hardware processor 204B (hereinafter alternatively collectively referred to as processor 204) and a memory 206, such as random access memory (RAM). The computer 202 may be coupled to, and/or integrated with, other devices, including input/output (I/O) devices such as a keyboard 214, a cursor control device 216 (e.g., a mouse, a pointing device, pen and tablet, touch screen, multi-touch device, etc.) and a printer 228. In one or more embodiments, computer 202 may be coupled to, or may comprise, a portable or media viewing/listening device 232 (e.g., an MP3 player, iPod™, Nook™, portable digital video player, cellular device, personal digital assistant, etc.). In yet another embodiment, the computer 202 may comprise a multi-touch device, mobile phone, gaming system, internet enabled television, television set top box, or other internet enabled device executing on various platforms and operating systems.

In one embodiment, the computer 202 operates by the general purpose processor 204A performing instructions defined by the computer program 210 under control of an operating system 208. The computer program 210 and/or the operating system 208 may be stored in the memory 206 and may interface with the user and/or other devices to accept input and commands and, based on such input and commands and the instructions defined by the computer program 210 and operating system 208, to provide output and results.

Output/results may be presented on the display 222 or provided to another device for presentation or further processing or action. In one embodiment, the display 222 comprises a liquid crystal display (LCD) having a plurality of separately addressable liquid crystals. Alternatively, the display 222 may comprise a light emitting diode (LED) display having clusters of red, green and blue diodes driven together to form full-color pixels. Each liquid crystal or pixel of the display 222 changes to an opaque or translucent state to form a part of the image on the display in response to the data or information generated by the processor 204 from the application of the instructions of the computer program 210 and/or operating system 208 to the input and commands. The image may be provided through a graphical user interface (GUI) module 218. Although the GUI module 218 is depicted as a separate module, the instructions performing the GUI functions can be resident or distributed in the operating system 208, the computer program 210, or implemented with special purpose memory and processors.

In one or more embodiments, the display 222 is integrated with/into the computer 202 and comprises a multi-touch device having a touch sensing surface (e.g., track pod or touch screen) with the ability to recognize the presence of two or more points of contact with the surface. Examples of multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 202 according to the computer program 210 instructions may be implemented in a special purpose processor 204B. In this embodiment, the some or all of the computer program 210 instructions may be implemented via firmware instructions stored in a read only memory (ROM), a programmable read only memory (PROM) or flash memory within the special purpose processor 204B or in memory 206. The special purpose processor 204B may also be hardwired through circuit design to perform some or all of the operations to implement the present invention. Further, the special purpose processor 204B may be a hybrid processor, which includes dedicated circuitry for performing a subset of functions, and other circuits for performing more general functions such as responding to computer program 210 instructions. In one embodiment, the special purpose processor 204B is an application specific integrated circuit (ASIC).

The computer 202 may also implement a compiler 212 that allows an application or computer program 210 written in a programming language such as COBOL, Pascal, C++, FORTRAN, or other language to be translated into processor 204 readable code. Alternatively, the compiler 212 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 210 accesses and manipulates data accepted from I/O devices and stored in the memory 206 of the computer 202 using the relationships and logic that were generated using the compiler 212.

The computer 202 also optionally comprises an external communication device such as a modem, satellite link, Ethernet card, or other device for accepting input from, and providing output to, other computers 202.

In one embodiment, instructions implementing the operating system 208, the computer program 210, and the compiler 212 are tangibly embodied in a non-transient computer-readable medium, e.g., data storage device 220, which could include one or more fixed or removable data storage devices, such as a zip drive, floppy disc drive 224, hard drive, CD-ROM drive, tape drive, etc. Further, the operating system 208 and the computer program 210 are comprised of computer program 210 instructions which, when accessed, read and executed by the computer 202, cause the computer 202 to perform the steps necessary to implement and/or use the present invention or to load the program of instructions into a memory 206, thus creating a special purpose data structure causing the computer 202 to operate as a specially programmed computer executing the method steps described herein. Computer program 210 and/or operating instructions may also be tangibly embodied in memory 206 and/or data communications devices 230, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 202.

Methodology Overview

Embodiments of the invention are implemented as a software application on a computer 200. In this regard, embodiments of the invention use an iterative bi-level optimization methodology and work in multiple stages. The first stage generates an initial set of PVI's. A bi-level methodology is then invoked that contains two levels. The lower level optimizes the earthwork cost for the given PVI's and returns this cost to the upper level. With help of the given earthwork cost, the upper level then changes the PVI's and curve configurations, in order to reduce the cost further.

Figure 3:
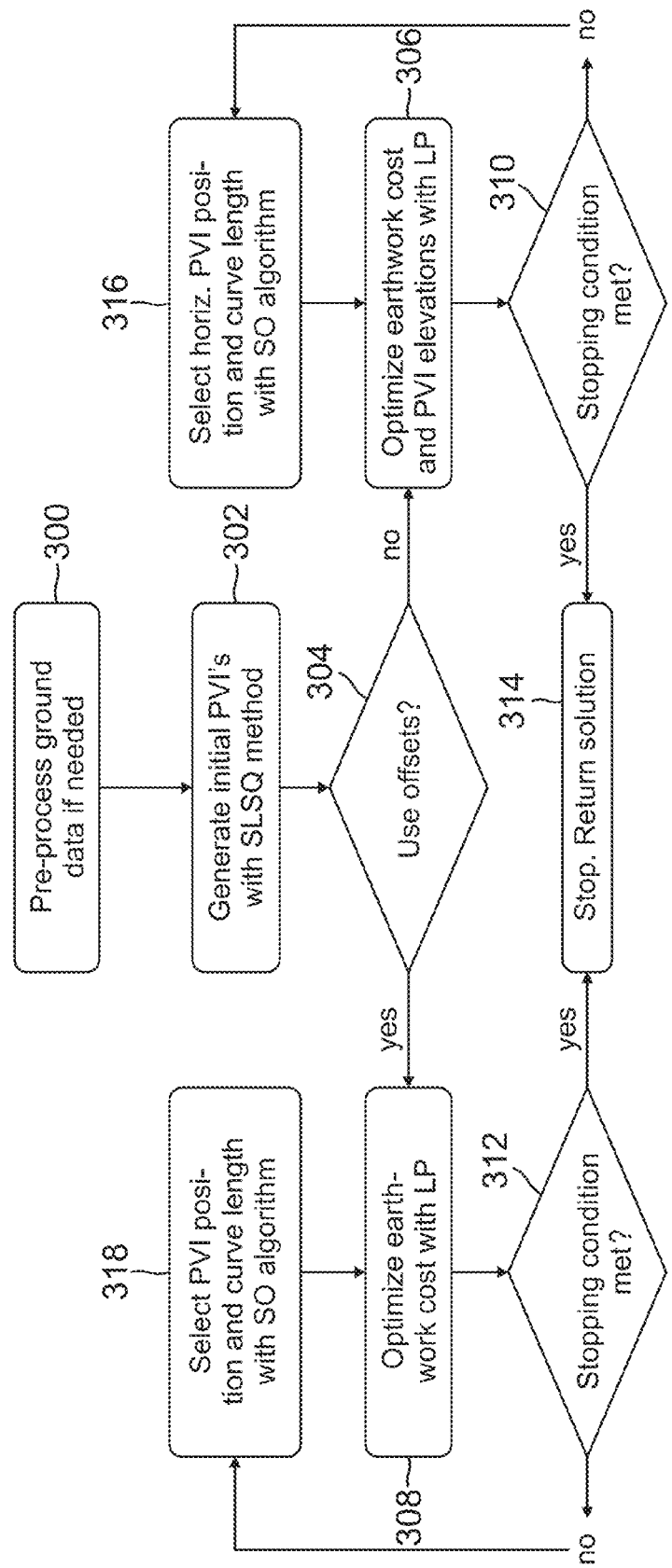
FIG. 3 illustrates a bi-level methodology for optimizing a road profile in accordance with one or more embodiments of the invention.

If the user provides only a single surface profile (no offsets), then the optimization of the PVI elevations (y-axis) happens in the lower level instead of the upper level. A schematic overview of the methodology is provided in FIG. 3. In this regard, FIG. 3 illustrates a bi-level methodology for optimizing a road profile in accordance with one or more embodiments of the invention.

At step 300, in order to handle very large amounts of surface data (lot of points), a modified Douglas-Peucker methodology may be used to filter the input data to keep only relevant points (i.e. points that lie all on one straight line carry little information and can be discarded). At step 302, the methodology starts by automatically generating an initial set of PVI's. This is done with the help of a modified Segmented Least Squares (SLSQ) methodology, that is normally used in statistics to fit lines to scientific data.

The lower level of the methodology consists of a modified LP (linear program) that incorporates new techniques to address the use of multiple soil layers, and the flaws in existing methods that resulted in uneven roads. The LP methodology optimizes the earthwork and, if no ground surface offsets are provided, also the elevation of each PVI, subject to design constraints. Accordingly, at step 304, a determination is made regarding whether ground surface offsets have been provided (and are to be used). If no offsets are used, the earthwork cost and PVI elevations are optimized using LP at step 306. Alternatively, if offsets are used, the earthwork cost is optimized using LP at step 308 (i.e., PVI elevations are not optimized in the LP, but in the SO method in 318).

The remaining steps are similar regardless of whether offsets are used. At steps 310 and 312, a determination is made regarding whether a stopping condition has been met. In steps 310 and 312, the resulting earthwork cost of the LP is stored in a data queue of a fixed size. The standard deviation of all the costs in the data queue is computed and compared to a given tolerance. If the standard deviation is below the tolerance, a stopping condition has been met. Accordingly, the methodology is stopped and the best solution found is returned at step 314.

If the above stopping criteria is not met, a Stochastic Optimization (SO) methodology may be used to update/select the PVI positions, as well as the vertical curve length at the PVI. In step 318, the updated/selected PVI positions are the horizontal position and the elevation, in step 318, it is the horizontal position only. The optimization (steps 306-308) is then repeated and the process continues until a stopping condition has been met (as determined at steps 310-312).

Preprocessing Input Data

Step 300 of FIG. 3 provides for the pre-processing of ground data if needed. Such a step is optional. The only required input data consists of the ground surface points of the existing ground along the centerline of the road. These points are referred to as the "existing ground profile" along the centerline. As explained below, each point on the existing ground profile becomes a decision variable in the LP. Hence, a large number of ground points results in a large problem that takes longer to solve. It is therefore desirable to remove some of these points. However, it is desirable to keep ground points that carry important information (surface structures like a ridge or a crevice). To determine which points to remove and which points to keep, the Douglas-Peucker methodology that is used in cartography [DP73, Ebi02] may provide a starting point. As explained below, even if some points carry little information, sufficiently many ground points per distance are needed for earthwork estimates. Hence even on segments where the Douglas-Peucker methodology would remove points, some points need to be kept. For example, if there are ten (10) points on a straight line, Douglas-Peucker would remove all but the first and last points. But some of these points need to be kept to compute the earthwork. Hence, embodiments of the invention modify the Douglas-Peucker methodology such that only every second point that is marked for removal is actually removed. Furthermore, the Douglas-Peucker methodology may be performed iteratively, with a reduction in the distance parameter (see [DP73] for details) at each iteration, until the number of grounds point is below a desired value. The same procedure applies to optionally provided offset ground profiles. Such a process of preprocessing is referred to as "surface weeding".

Generating Initial Set of PVI's

Step 302 of FIG. 3 provides for generating the initial set of PVIs. Embodiments of the invention generate initial PVI's based on a Segmented Least-Squares (SLSQ) methodology, a dynamic programming methodology that is used in statistics to fit lines or curves to scientific data [KT06].

Figure 4:
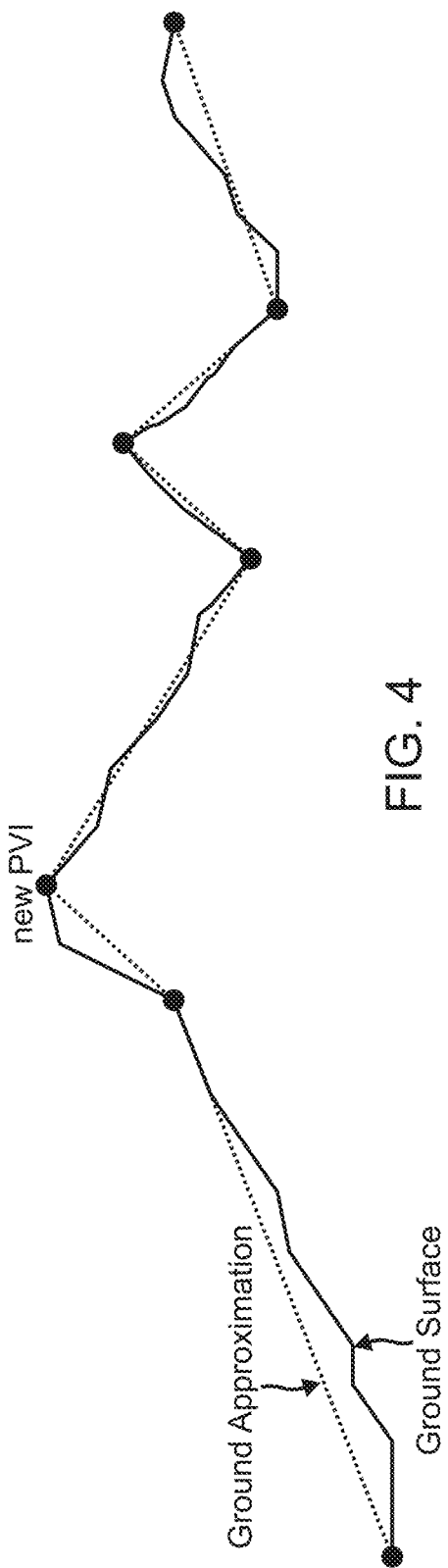
FIG. 4 illustrates the generation of PVIs of step 302 of FIG. 3 in accordance with one or more embodiments of the invention.

From step 300, the data points consist of the existing ground points of the surface (e.g., after optional surface weeding), and the existing ground surface profile is approximated with a set of straight lines of minimal length. FIG. 4 illustrates the generation of PVIs of step 302 in accordance with one or more embodiments of the invention. The dotted lines are an approximation of the ground surface (black line). The intersections of the lines build new PVIs.

Consider a line that approximates all the surface points between a ground point i and another ground point j. The best fit for such a line can be computed using the Least Squares method from linear algebra. The resulting approximation error of the line is denoted as $e_{ij}$. Since it is desirable to use a minimal number of lines, each line also contains a penalty value C. The SLSQ methodology can then be stated as a mathematical recursion, starting with the last segment $$OPT(n) = e_{in} + C + OPT(i-1),$$

where n is the number of ground points, and $$OPT(j) = \min_{1 \le i \le j} (e_{ij} + C + OPT(i-1)).$$

Hence, embodiments of the invention attempt to minimize the total of error and penalty (i.e. approximate the ground surface with as few lines as possible, and as close to the surface as possible). The details of the existing SLSQ methodology can be found in [KT06].

For each pair of ground points $e_{ij}$ is computed via Least-Squares. For n ground points, this can be computed in a computational complexity of $O(n^2)$.

Figure 5:
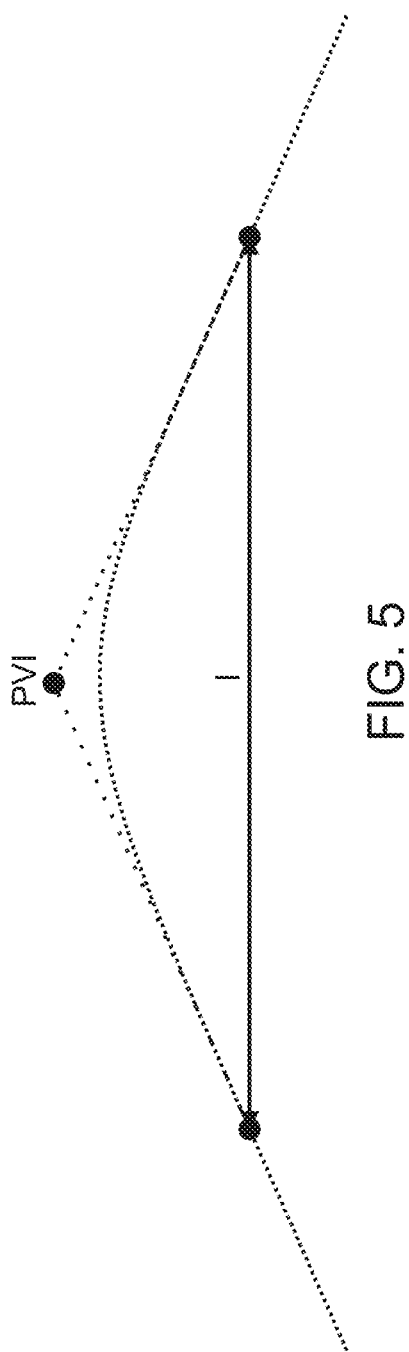
FIG. 5 illustrates the initial curve length being set to 0.9 times half the distance of the closest neighbor PVI in accordance with one or more embodiments of the invention.

In road design, there are constraints that require a minimal tangent length for a given design speed (i.e. the length of the line that connects two PVI's). To address these constraints, $e_{ij}$ may be defined as:

$$e_{ij} = \begin{cases} +\infty, & \text{if } |p_i - p_j| < d_{min}, \\ e_{ij}, & \text{otherwise,} \end{cases}$$

where $p_i$ is the horizontal position of ground point i, and $d_{min}$ is the minimum tangent length. This reduces the number of Least-Squares computations significantly. An initial set of PVI's can then be computed. To each PVI i, a vertical curve of length $l_i$ is added (see FIG. 5). In this regard, FIG. 5 illustrates the initial curve length being set to 0.9 times half the distance of the closest neighbor PVI in accordance with one or more embodiments of the invention:

$$l_i = 0.9 \min(|p_i - p_{i-1}|, |p_{i+1} - p_i|),$$

where $p_i$ is the horizontal position of PVI i.

Lower Level Optimization

To optimize the earthwork (and PVI elevation in the case of no offsets), the LP method from [Mor09], and [KL10] is significantly modified. The optimization process is described in three parts below. In a first part, earthwork and hauling costs that handle multiple surfaces and sub-sections are computed. In a second part, a brief overview how the earthwork is connected to the elevation optimization of the PVI's, in case that the user provides only the ground surface profile for the centerline (no offsets), is described. An emphasis is placed on the new techniques involved. In a third part, an explanation of how the earthwork is computed, in the case where the user provides offset profiles for the ground surface, is presented.

Earthwork with Single Ground Profile Only

The elevation of two adjacent PVI's determines the grade of the tangent between the two points and, consequently, the earthwork volumes between the tangent and the ground surface. The major cost factors in the LP model (of embodiments of the invention) are excavation, embankment, and haul costs. This section describes how the earthwork and hauling costs are computed.

This section is roughly divided into four parts. First, the complete mathematical model that is used by the methodology (of embodiments of the invention) to compute the earthwork and hauling cost in LP (I) is described. Second, a detailed description with explanations of the new technique of using sub-sections is given. Third, new methods to compute cut and fill quantities for multiple soil layers are introduced. The concluding fourth section provides an explanation of new hauling constraints that take the multiple soil layers into account.

Following is the LP (I).

$$\min \sum_{g \in G} \left( \sum_{\substack{i,j \in S \\ j \neq i}} c_{ijg} x_{ijg} + \sum_{\substack{i \subset S \\ j \in W}} c_{ijg} x_{ijg} + \sum_{\substack{i \subset B \\ j \in S}} c_{ijg} x_{ijg} + \sum_{k \in P} (wL_k(c_{kg}^+ h_{kg}^+ + c_{kg}^- h_{kg}^-) + c_{kg}^{AUX} h_{kg}^{AUX} + c_k^+ h_k^+ + c_k^- h_k^-) \right) \quad (1)$$

$$\text{s.t.} \sum_{g \in G} \left( \sum_{\substack{j \in S \\ j \neq i}} (x_{ijg} - x_{jig}) + \sum_{j \in W} x_{ijg} - \sum_{j \in B} x_{jig} \right) = \sum_{k \in P_i} (h_k^+ - h_k^-) wL_k \quad (2)$$

for all $i \in S$, $$\sum_{\substack{j \in S \\ j \neq i}} (x_{ijg} - x_{jig}) + \sum_{j \in W} x_{ijg} - \sum_{j \in B} x_{jig} \geq \sum_{k \in P_i} h_{kg}^- \cdot wL_k \quad (3)$$

for all $i \in S, g \in G$, $$\sum_{\substack{j \in S \\ j \neq i}} (x_{ijg} - x_{jig}) + \sum_{j \in W} x_{ijg} - \sum_{j \in B} x_{jig} \leq \sum_{k \in P_i} h_{kg}^+ \cdot wL_k \quad (4)$$

for all $i \in S, g \in G$, $$h_k^+ = \sum_{g \in G} h_{kg}^+ \text{ for all } k \in P \quad (5)$$

$$h_k^- = \sum_{g \in G} h_{kg}^- \text{ for all } k \in P, \quad (6)$$

$$h_{kg} = h_{kg}^+ - h_{kg}^- \text{ for all } k \in P, g \in G, \quad (7)$$

$$h_{kg}^+ = h_{kg}^{+HELP} + h_{kg}^{AUX} \text{ for all } k \in P, g \in G, \quad (8)$$

$$h_{kg}^{+HELP} = H_{kg} - H_{k0} + h_k^+ - \sum_{m=g+1}^{|G|} h_{km}^+ \text{ for all } k \in P, g \in G, \quad (9)$$

$$h_{kg}^- \leq \lambda_g h_k^- \text{ for all } k \in P, g \in G, \quad (10)$$

$$\sum_{\substack{j \in S \\ j \neq i}} x_{jig} \leq C_{ig}, \text{ for all } i \in W, g \in G, \quad (11)$$

$$\sum_{\substack{j \in S \\ j \neq i}} x_{ijg} \leq C_{ig}, \text{ for all } i \in B, g \in G, \quad (12)$$

$$x_{ijg}, h_k^+, h_k^-, h_{kg}^+, h_{kg}^-, h_{kg}^{AUX} \geq 0, \text{ for all } i, j \in S, g \in G, k \in P. \quad (13)$$

where

G is the set of indices for Ground surfaces,

S is the set of indices for earthwork Sections,

P is the set of indices for earthwork Sub-Sections which are between two surface points, $P_i$ is the set of indices for earthwork Sub-Sections within Section i, W is the set of indices for Waste pits, B is the set of indices for Borrow pits, $c_{ijg} \in R$ is the cost to haul one cubic unit of material g from section i to section j, $c_{kg}^+ \in R$ is the cost to cut one cubic unit of material g in sub-section k, $c_{kg}^- \in R$ is the cost to fill one cubic unit of material g in sub-section k, $c_{kg}^{AUX} \in R = g \cdot (Pc_{ijm} P_\infty + \epsilon)$ is an auxillary cost to obtain cut values, $x_{ijg} \in R$ is the amount of material g that is hauled from section i to section j, $L_k \in R^+$ is the length of sub-section k, $w \in R^+$ is the width of the road, $h_k^+$ is the average height of cut that is done in sub-section k with respect to the average height of the ground surface, $h_k^-$ is the average height of fill that is done in sub-section k with respect to the average height of the ground surface, $h_{kg}$ is the average net height of cut and fill for material g that is done in sub-section k.

$\lambda_g \in [0,1]$ is the percentage of material g that can be used in a fill.

$h_{kg}^+$ is the average height of cut for material g that is done in sub-section k with respect to the average height of the ground surface, $h_{kg}^-$ is the average height of fill for material g that is done in sub-section k with respect to the average height of the ground surface, $h_{kg}^{+HELP}$ is the average net cut height for surface g, negative values mean that no cut is done, $h_{kg}^{AUX}$ is an auxillary variable to help obtain non-negative values from $h_{kg}^{+HELP}$, $H_{kg}$ is the actual average height of surface g in sub-section k, $C_{ig}$ is the capacity of pit i for material g.

As in [KL10], a road design may be divided into earthwork sections. For the remainder of this description, let S be the set of all earthwork sections and |S| is the number of all sections. Embodiments of the invention introduce the use of sub-sections for each earthwork section. The use of subsections is a new approach to minimize excavation and embankment that was not taken into account in any other prior art methods.

Figure 6:
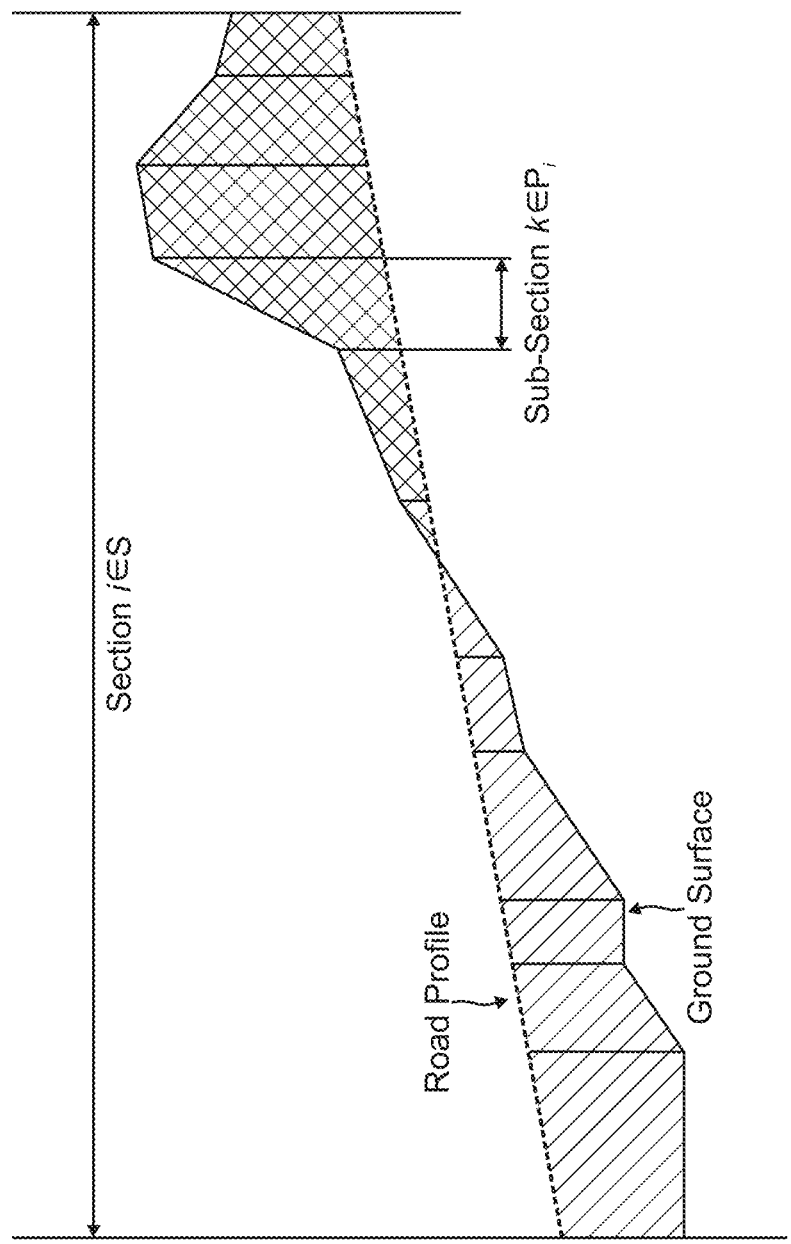
FIG. 6 illustrates an earthwork section with sub-sections of cut or fill in accordance with one or more embodiments of the invention.

Sub-sections are the region between two ground surface points. Let P be the set of all sub-sections, and $P_i$ the set of all sub-sections in section i. Referring to FIG. 6, if, in a sub-section, the road profile (dotted line) is above the ground surface (solid line), the sub-section is a fill (e.g., illustrated as diagonal hatching), otherwise it is a cut (e.g., illustrated as cross hatching). Thus, FIG. 6 illustrates an earthwork section with sub-sections of cut or fill in accordance with one or more embodiments of the invention.

For single centerline ground profile, a given road profile, and a sub-section k, the fill or cut volume $V_k$ of the sub-section is computed as $V_k=(h_k^+-h_k^-)wL_k$, where $h_k^+$ is the average height of cut, $h_k^-$ the average height of fill, and $L_k$ the length of the sub-section. In the case of a single ground profile for the centerline, a constant road-width w is assumed (retaining walls on the left and the right of the road), since there are no available offsets that provide additional information. Each sub-section does therefore incur an earthwork cost. The cost is computed linearly. For a given soil material g, a certain dollar value $c_{kg}^+$ is taken for excavation, and $c_{kg}^-$ for embankment and the dollar value is multiplied by the average cut and fill height of the corresponding sub-section. These costs are added for all soil layers in the set G, and the total is multiplied by $L_k$. The result is the total earthwork cost, excluding hauling costs, of sub-section k. The earthwork cost of all sub-sections may be summed and the term placed into the objective function (1) of an LP, in order to minimize excavation and embankment.

The introduction of sub-sections is a major improvement over existing LP approaches and allows for a much more accurate estimation of excavation and embankment costs. Furthermore, it acts against a tendency of existing models, to produce uneven roads. To visualize the benefits, one may imagine two PVI's that are placed in the same section. The LP methodology could produce a solution where the first PVI is placed very low below the ground surface, and the second PVI very high above the ground surface. The road profile will then cross the ground surface somewhere within the section, creating a large cut in the first part, and a large fill in the second part. If only sections are used, the net-volume that results from subtracting the fill from the cut volume could well be zero. Accordingly, an assumption would be made that there is no earthwork happening in the section and the cost for the section results in zero. In embodiments of the present invention, sub-sections are very close together. Due to the minimum tangent constraint, imposed by the design speed, there will be no two PVI's in the same sub-section (provided a reasonable number of ground points are maintained, as described above).

Figure 7:
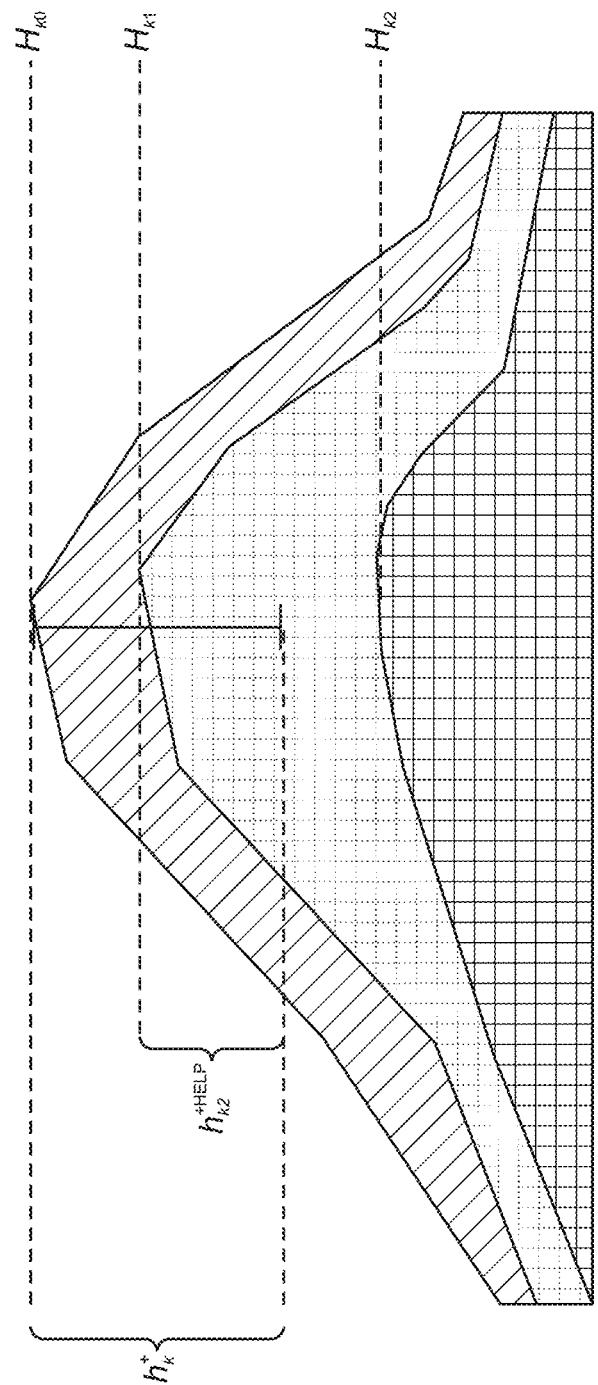
FIG. 7 illustrates the computation of a net cut height of material g with the variable $h_{kg}^{+HELP}$ given a total cut height $h_k^+$ in accordance with one or more embodiments of the invention.

Researchers have stated that LP approaches could potentially be extended to the use of multiple soil layers. However, none of the prior art has shown a practical method to do this. The major difficulty in using multiple soil layers is to find the average height of cut $h_{kg}^+$ and the average height of fill $h_{kg}^-$ per material. Furthermore, in practice, a construction engineer wants to use mixed materials for a fill, or limit some materials. In order to understand how $h_{kg}^+$ is computed in embodiments of the invention, one may examine FIG. 7 which illustrates the computation of a net cut height of material g with the variable $h_{kg}^{+HELP}$ given a total cut height $h_k^+$.

Given a total cut height $h_k^+$ for sub-section k, it is desirable to compute the cut height $h_{kg}^+$ of material g in that sub-section. One begins by introducing a helper variable $h_{kg}^{+HELP}$. According to FIG. 7, $H_{kg}$ is the average height of ground layer g in sub-section k. One may therefore compute $h_{kg}^{+HELP}$ as the difference $$h_{kg}^{+HELP} = H_{kg} - H_{k0} + h_k^+ - \sum_{m=g+1}^{|G|} h_{km}^+.$$

Such a computation is done in (9) (of the linear program recited above). One may see that this can result in a negative value. Since a cut height is always non-negative, one may use (8) to compute the final cut height $h_{kg}^+$, where $h_{kg}^{+AUX}$ is a non-negative variable that is multiplied by a large constant $c_{kg}^{+AUX}$ in the objective function (1). The values of the constants $c_{kg}^{+AUX}$ for the materials g∈G are chosen such that $c_{k,g+1}^{+AUX}=(c_{k,g}^{+AUX})^2$. Hence, the result is:
$c_{k0}^{+AUX}<c_{k1}^{+AUX}< \ldots <c_{k|G|}^{+AUX}$, which will prevent the solver from selecting cut materials from a lower layer, before the upper layers are taken away. Finally, the total cut height $h_k^+$ must equal the sum of all material cuts $\Sigma_{g \in G} h_{kg}^+$. This is done in (5).

The fill height $h_k^-$ of sub-section k is the total of all fill materials $\Sigma_{g \in G} h_{kg}^-$. This is done in (6). However, is desirable to have the construction engineer able to limit the amount of material g to be used in a fill. Accordingly, one may let the parameter $\lambda_g \in [0,1]$ be the allowed percentage of fill for material g. In order to limit material g in the total fill $h_k^-$ by $\lambda_g$, $h_{kg}^- \le \lambda_g h_k^-$. This is done in (10).

Figure 8:
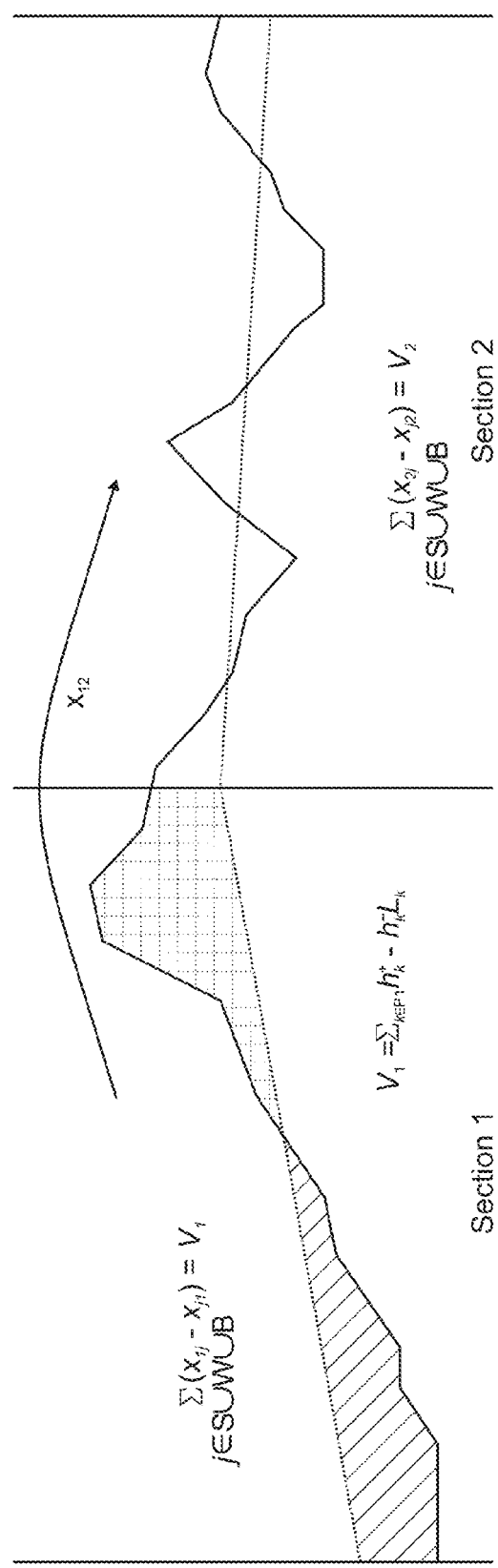
FIG. 8 illustrates two earthwork sections in accordance with one or more embodiments of the invention.

It remains to compute the hauling cost. Hauling costs may be computed similar to the approaches in [Mor09], and [KL10]. In embodiments of the invention, it may be assumed that the hauling costs within a earthwork section are small and negligible. Hence, for comptuations, the only concern is that of hauling material from a section i∈S to another section j∈S,i≠j, or from a borrow pit i∈B to a section i∈S. For that, a net-volume $V_i$ is calculated per section, which is computed by $V_i=\Sigma_{k \in P_i}(h_k^+-h_k^-)wL_k$. If the net-volume is positive, a surplus results. If the net-volume is negative, a demand results (see FIG. 8). FIG. 8 illustrates two earthwork sections. The net volume $V_1$ in section 1 is the total of all cuts minus all fills. Hauling quantities from section 1 to section 2 are depicted as $x_{12}$. Constraint (2) ensures that the demand and surplus of each section are eliminated through hauling $x_{ijg}$ of material g from section i to section j. Hauling costs are minimized in the objective function (1) by adding a haul cost $c_{ijg}$ to each move. More details on the hauling and also on limiting borrow and waste capacities in constraint (11), and (12) can be found in [KL10]. A new addition that may be utilized in embodiments of the invention is (3) and (4). These two constraints are required for the limitation of material to be functional. If the sub-section k is a fill, $h_{kg}^+=0$ for all g∈G. Hence, for all g∈G, constraint (3) becomes $$\sum_{\substack{j \in S \\ j \ne i}} (x_{ijg} - x_{jig}) + \sum_{j \in W} x_{ijg} - \sum_{j \in B} x_{jig} \ge \sum_{k \in P_i} h_{kg}^- \cdot L_k = \lambda_g \sum_{k \in P_i} h_k^- \cdot wL_k,$$

and constraint (4) becomes $$\sum_{\substack{j \in S \\ j \neq i}} (x_{ijg} - x_{jig}) + \sum_{j \in W} x_{ijg} - \sum_{j \in B} x_{jig} \leq 0.$$

Hence the fill quantity for each material needs to be between zero and the allowed percentage for fill. If the sub-section is a cut, the two equations become an equality of the form $$\sum_{\substack{j \in S \\ j \neq i}} (x_{ijg} - x_{jig}) + \sum_{j \in W} x_{ijg} - \sum_{j \in B} x_{jig} = \sum_{k \in P_i} h_{kg}^+ \cdot wL_k,$$

which is simply a redundant constraint to (2).

Road Grades and PVI Elevation for Single Ground Profile Only

The LP connects the grades road profile with the earthwork optimization in a similar way to that in [KL10]. The model contains variables that define the elevation of the PVI's and the curvature of the vertical curve at each PVI. Through constraints that limit grades and grade changes, the solver than changes the elevation and curvature of PVI's in order to get a road profile that produces net-volumes for the sections that minimize hauling costs and earthwork. The complete mathematical model is shown in LP (II) below:

$$\min f(z) \quad (14)$$

$$\text{s.t. } a_{2i} = \frac{m_i - m_{i-1}}{2l_i}, \text{ for all } i \in M, l_i > 0, \quad (15)$$

$$a_{1i} = m_i - 2a_{2i}(p_i^{start}), \text{ for all } i \in M, l_i > 0, \quad (16)$$

$$a_{0i} = m_i(p_i^{start}) + b_i - a_{2i}(p_i^{start})^2 - a_{1i}(p_i^{start}),$$
$$\text{for all } i \in M, l_i > 0, \quad (17)$$

$$m_i - m_{i-1} \geq -A_i, \text{ for all } i \in M, l_i > 0, \quad (18)$$

$$m_i - m_{i-1} \leq A_i, \text{ for all } i \in M, l_i > 0, \quad (19)$$

$$a_{2i} = 0, \text{ for all } i \in M, l_i = 0, \quad (20)$$

$$a_{1i} = 0, \text{ for all } i \in M, l_i = 0, \quad (21)$$

$$a_{0i} = 0, \text{ for all } i \in M, l_i = 0, \quad (22)$$

$$\frac{1}{L_k} \sum_{i \in I_k} \left( \int_{t_1}^{t_2} \sum_{j=0}^{2} a_{ji} x^j dx + \int_{t_2}^{t_3} m_i x + b_i dx + \int_{t_3}^{t_4} \sum_{j=0}^{2} a_{j,i+1} x^j dx \right) = H_{k0} + h_k^+ - h_k^-, \quad (23)$$

for all $k \in P$, $$m_i p_i + b_i = m_{i+1} p_i + b_{i+1}, \text{ for all } i \in M, \quad (24)$$

$$-M_{max} \leq m_i \leq M_{max}, \text{ for all } i \in M. \quad (25)$$

where f(z) is the earthwork optimization LP (I),

M is the set of road segments which are between two PVI's, $a_{ji}$ is the j-th degree coefficient of the curve at the start of segment i, $l_i$ is the fixed curve length of the curve at the start of segment i, $m_i$ is the slope of the grade line in segment i, $b_i$ is the offset of the grade line in segment i, $p_i$ is the x-axis position of the left PVI for segment i, $p_i^{start} = p_i - l_i/2$, $p_i^{end} = p_i + l_i/2$, $A_i$ is the maximal grade change for curve i, $I_k = \{p_i : p_i$ is inside or adjacent to subsection $k\}$, $x_k^{start}$ is the start position on the x-axis of subsection k, $x_k^{end}$ is the end position on the x-axis of subsection k, $t_1 = \max(p_i, x_k^{start})$, $t_2 = \min(p_i^{end}, x_k^{end})$, $t_3 = \min(p_{i+1}^{start}, x_k^{end})$, $t_4 = \min(p_{i+1}, x_k^{end})$, $M_{max}$ is the maximal slope for the design.

As described above, it is known that, for each PVI i, the horizontal position $p_i$ and the vertical curve length $l_i$ are given to the lower level LP methodology from the upper level search routine. Hence the set of all road segments M that lie between the PVI's is given.

The American Association of State Highway and Transportation Officials (AASHTO) provide a policy on design constraints with respect to grades, and vertical curves of road profiles [AAS04]. The curves that used herein are parabolic, thus modeled by a $2^{nd}$ degree polynomial. For a given curve length $l_i$ the computation of the formulas for the curve coefficients $a_{ji}$, where j is the degree of the term in the polynomial, are provided in [AAS04]. They are represented by constraints (17), (16), and (15).

The absolute grade change between two road tangents is restricted by the design speed. AASHTO requires that for a PVI i, incomig grade $m_i-1$ and outgoing grade $m_i$, $$|m_i - m_{i-1}| \leq A_i,$$

where $A_i$ is the maximal allowed grade change for the given design speed and curve length $l_i$. Such restrictions are enforced with constraints (18) and (19). The formula and tables to compute $A_i$ can be found in [AAS04].

If the upper level methodology sets a curve length $l_i$ to zero, the constraints (20) to (22) ensure that no curve is designed.

As in [KL10], the road profile is connected with the earthwork volumes from (as described above) via a linear constraint. The new features of embodiments of the invention require the addition of one such constraint for every sub-section. The constraint is formulated as an equation, that sets the integration of the earth volume between the road profile and the ground surface equal to the cut or fill height in the earthwork LP (I). This is done in (23). Note that scaling by $1/L_k$ may be performed due to the use of average heights on the right-hand side of the equation.

Constraint (24) ensures continuity of the road profile and constraint (25) sets a limit on the maximal grade (e.g., similar to that described in [KL10]).

Earthwork with Ground Profile Offsets

If a user provides profile offsets for the ground surface, earthwork volumes can be computed much more accurate. However, since these volumes change not linearly with respect to the road elevation anymore (the width of the road and adjacent slopes cannot be represented by a constant road width), the optimization of the PVI elevations and grades is moved into the upper level and the LP extensions in LP (2) (as described above with respect to the road grades and PVI elevation for single ground profile only) are not used in this case. Furthermore, the LP (1) (as described above with respect to earthwork with single ground profile only) may be adapted as follows.

Figure 9:
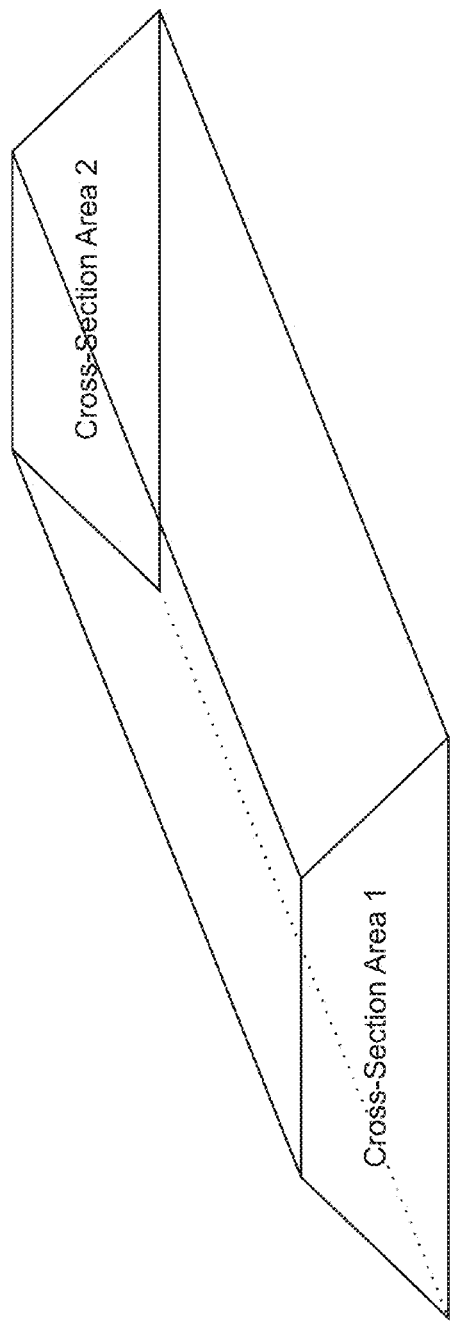
FIG. 9 illustrates the volume between two cross sections (cross section area 1 and cross section area 2) in accordance with one or more embodiments of the invention.

Equations (8) and (9) are discarded. Since the volumes are now computed outside of the LP, the length and width of the road in the LP are no longer needed. Hence, in equations (1, 2, 3) and (4), one may simply let $wL_k=1$ and for the variables denoted by h, actual volumes may be used instead of heights. Hence, the following equations may be added to the LP.

$$h_k^- = \sum_{g \in G} V_{kg}^- \text{ for all } k \in P, \tag{26}$$

$$h_{kg}^+ = V_{kg}^+ \text{ for all } k \in P, g \in G, \tag{27}$$

where $V_{kg}^-$ is the fill volume, and $V_{kg}^+$ is the cut volume computed outside of the LP. To compute these volumes, the Average End-Area method that is commonly used in civil engineering [Bur97] may be used. In this method, for every sub-section, the cross-section at either end of the sub-section is examined. The cut and fill area of each cross-section is computed. Each of these areas is then multiplied by half of the distance between the two cross-sections (see FIG. 9). In this regard, FIG. 9 illustrates the volume between two cross sections (cross section area 1 and cross section area 2) in accordance with one or more embodiments of the invention.

Figure 10:
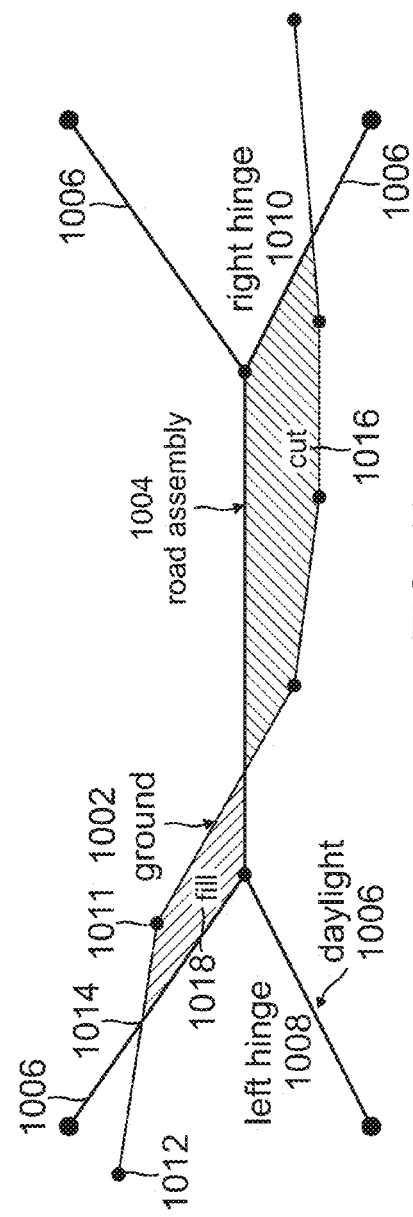
FIG. 10 shows a cross-section with the existing ground (EG) below, and the road assembly on top in accordance with one or more embodiments of the invention.

The difficult part is to compute the cut and fill areas of the cross-sections as efficiently as possible. For this, referring to FIG. 10, a new procedure is introduced that uses a sweep line approach. FIG. 10 shows a cross-section with the existing ground (EG) 1002 below, and the road assembly 1004 on top. A road assembly 1004 has daylights 1006 on either side (the slopes that go down to or up from the side of the road). Daylights 1006 join the assembly 1004 at a hinge point 1008 and 1010.

The procedure starts at the left hinge point 1008 and uses a sweep line until it encounters the next ground point 1011 to the left. The procedure checks if an intersection of the daylight 1006 with the ground 1002 happened on the right of this ground point 1011. If not, which is the case in the example of FIG. 10, the area between the daylight 1006 and the ground 1002 can be computed with a simple integral (top and bottom functions are lines, thus a simple linear integration). The result is multiplied by $0.5L_k$. If the resulting volume is a positive value, it is added to $V_{kg}^+$ as cut area, if it is negative, it is added to $V_{kg}^-$ as a fill area. The procedure continues with the sweep line to the next ground point 1012. Once the first intersection 1014 of the daylight 1006 with the ground 1002 is found, the process stops. The last integral is then computed between the intersection point 1014 and the previous ground point to the right 1011. The procedure then moves back to the left hinge point 1008 and uses the same technique in the right direction, until the right hinge point 1010 is reached. However, instead of the daylight line 1006, it uses the lines of the assembly 1004. Once the procedure reaches the right hinge point 1010, it uses the right daylight 1006 again until it intersects the ground 1002. The procedure is therefore able to obtain the final total cut area 1016 and the final fill area 1018 by considering each ground point and road assembly point only once. Such a procedure may be referred to as Cross Section Volumes.

Bi-Level Methodology with PVI Location and Curve Length Optimization

The existing LP's in [Eas88, Mor96, Mor09, KL10] are only optimizing the elevation of existing PVI's. If a single ground surface profile is provided, the LP of embodiments of the present invention optimizes the elevation as well. However, if one desires to incorporate the horizontal position of a PVI into the same LP, it results in non-linearities. The same happens if the non-linear volume computations (described above) are used. Accordingly, embodiments of the invention utilize a bi-level methodology To address the non-linearities, a Stochastic Optimization (SO) is utilized that belongs to the family of Derivative Free Optimization (DFO) methodologies. SO methods are optimization methods that generate and use random variables. For stochastic problems, the random variables appear in the formulation of the optimization problem itself, which involve the objective functions and constraints. Stochastic optimization methods also include methods with random iterates. Some stochastic optimization methods use random iterates to solve stochastic problems, combining both meanings of stochastic optimization. DFO methods are optimization methods that work only with function values. They do not need any gradient or second-order information of the function.

For the particular SO method, embodiments of the invention may utilize a Covariance Matrix Adaptation Evolution Strategy (CMA-ES). CMA-ES is a stochastic, derivative-free method for numerical optimization of non-linear or non-convex continuous optimization problems. For more details about CMA-ES, one may refer to [HO01] and [Han06].

Embodiments of the invention need an initial starting point (a vector of values). If the PVI elevation is optimized in the lower level (single surface profile only), this starting point contains the PVI x-position and the vertical curve length ($p^0$, $l^0$). If the PVI elevation is optimized in the lower level (ground surface profile offsets provided), the starting point also contains the PVI elevation, which corresponds to the zero degree coefficients $a_0$ in LP (II). Hence, in that case the starting point is ($p^0$, $l^0$, $a^0$). An objective function that results in a value $f^0$ is then called, and the SO methodology produces a new set of points with a potentially improved function value. This is done iteratively, and with each iteration k, the objective function value $f^k$ is reduced or remains the same. Bound constraints handling may be added (as well as general constraints handling) via penalty terms to the random objective function.

The objective function may be viewed as the core of the bi-level methodology of embodiments of the invention. It is the interface between the upper level and the lower level described above. Since there are two modes of operations, one with a single ground profile, and one with ground profile offsets, two slightly different objective functions may be introduced. Such procedures are referred to as VertObjFuncSingle, and VertObjFuncOffsets. Both verify the given variables $p_i$ and $l_i$ for $i \in M$. VertObjFuncOffsets verifies also the additional variables $a_{0i}$. If the variables are feasible with respect to design constraints, both procedures solve the LP (I). VertObjFuncSingle also solves the LP (II) to obtain the PVI elevations $a_{0i}$. Both return the objective value of LP (I) to the SO methodology. If the variables are not feasible, a corresponding penalty is returned. The penalty is then taken into account by the SO methodology. An outline of the two objective functions is shown in Table 1 below. Referring to Table 1, statement (i) implements the design constraint requiring a minimal distance $d_{min}$ between the PVI's. Statement (ii) ensures that vertical curves of adjacent PVI's are not overlapping. Both statements return ∞ if the constraint is violated. Otherwise, the procedure will call an LP methodology to solve LP (II). The last part in statement (iii) computes the required minimal curve length $l_{min}$ for the given design speed and grades, and generates a penalty value $\|l_{min} - l_i\|^2$ if $l_i < l_{min}$.

The full methodology set forth in Table 1 may now be examined. Ground surface data, the maximum number of iterations, and a tolerance ϵ are input. In the main section, the process begins by classifying the surface data. If there are more ground points than a fixed threshold, SurfaceWeeding is called to reduce the number of ground points. SLSQ is then called to generate an initial set of PVI's ($p^0$, $l^0$). Using the initial set, the earthwork cost $f^0$ is computed by optimizing the elevation and grades of these PVI's with VertObjFunc. A loop is entered that runs the SO methodology at each iteration k, in order to produce new sets of PVI's ($p^k$, $l^k$) and compute $f^k$ with VertObjFunc. After twenty (20) iterations, the mean μ of the last 20 function values $f$ is computed, as well as the standard deviation σ of these values. This is done in statement (vii). The methodology is stopped if the standard deviation reached tolerance ϵ or if the maximum number of iterations is reached.

TABLE 1

VertOpt

```
procedure VertObjFuncSingle (p, l)
    for each i ∈ M do
        if p_i < p_{i-1} + d_min then                              (i)
            return (∞)
        endif
        if p_{i-1} + l_{i-1}/2 ≥ p_i - l_i/2 then                  (ii)
            return (∞)
        endif
    endfor
    Solve LP (I) and (II) together.
    f ← Solution of LP (I) using (p, l)
    for each i ∈ M do
        l_min = 100 |m_i - m_{i+1}|K
        if l_i < l_min then                                        (iii)
            return (f + ‖l_min-l_i‖²)
        endif
    endfor
    return (f)
endprocedure
procedure VertObjFuncOffsets (p, l, a)
    for each i ∈ M do
        g_1 = (α_i - α_{i-1})/(p_i - p_{i-1})   (slope between PVI i − 1 and i)

g_2 = (α_{i+1} - α_i)/(p_{i+1} - p_i)   (slope between PVI i and i + 1)
```

TABLE 1-continued

VertOpt

```
        if |g_1| ≥ M_max then                                      (iv)
            return (∞)
        endif
        if |g_1 - g_2| ≥ A_i then                                  (v)
            return (∞)
        endif
    endfor
    CrossSectionVolumes (p, l, a)
    Solve LP (I).
    f ← Solution of LP (II) using (p, l)
    for each i ∈ M do
        l_min = 100 |m_i - m_{i+1}|K
        if l_i < l_min then                                        (vi)
            return (f + ‖l_min - l_i‖²)
        endif
    endfor
    return (f)
endprocedure
main VertOpt (Surface profiles, MaxIterations, ϵ)
    for each Surface profile do
        if Number of surface points > threshold then
            SurfaceWeeding (Surface profile)
        endif
    endfor
    (p_0, l_0) ← SLSQ (Surface)
    n ← Number of Surface profiles
    if n > 1 then
        f_0 ← VertObjFuncOffsets (p_0, l_0, a_0)
    else
        f_0 ← VertObjFuncSingle (p_0, l_0)
    endif
    k ← 1
    repeat
        if n > 1 then
            f_k ← VertObjFuncOffset (p_k, l_k, a_k)
            Update (p_k, l_k, a_k) using CMA-ES method.
        else
            f_k ← VertObjFuncSingle (p_k, l_k)
            Update (p_k, l_k) using CMA-ES method.
        endif
        if k ≥ 20 then
```

$$\mu \leftarrow 20^{-1} \sum_{i=k}^{k-20} (f^i - \mu)^2 \quad \quad (vii)$$

$$\sigma \leftarrow \sqrt{19^{-1} \sum_{i=k}^{k-20} (f^i - \mu)^2}$$

```
        endif
        k ← k + 1
    until σ ≤ ϵ or k ≥ MaxIterations
    return ((p_k, l_k). Solution of LP (I))
endmain
```

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[AAS04] *A policy on geometric design of highways and streets:* 2004. American Association of State Highway and Transportation Officials, 2004.

[ASA05] Kazuhiro Aruga, John Sessions, and Abdullah E. Akay. Heuristic planning techniques applied to forest road profiles. *Journal of Forest Research,* 10(2):83-92, 2005.

[Bur97] Deryl Burch. *Estimating Excavation.* Craftsman Book Company, 1st. edition, 1997.

[CGF89] E P Chew, C J Goh, and T F Fwa. Simultaneous optimization of horizontal and vertical alignments for highways. *Transportation Research Part B: Methodological,* 23(5):315-329, 1989.

[DP73] David H Douglas and Thomas K Peucker. Algorithms for the reduction of the number of points required to represent a digitized line or its caricature. *Cartographica: The International Journal for Geographic Information and Geovisualization,* 10(2):112-122, 1973.

[Eas88] Said M Easa. Selection of roadway grades that minimize earthwork cost using linear programming. *Transportation Research. Part A: general,* 22(2):121-136, 1988.

[Ebi02] Konrad Ebisch. A correction to the Douglas-Peucker line generalization algorithm. *Computers & Geosciences,* 28(8):995-997, 2002.

[Han06] Nicolas Hansen. The CMA evolution strategy: a comparing review. *Towards a new evolutionary computation, Advances on estimation of distribution algorithms,* Springer, 2006, p 1769-1776.

[HO01] N Hansen and A Ostermeier. Completely derandomized self-adaptation in evolution strategies. *Evolutionary Computing,* 9(2):159-195, 2001.

[JS03] J Jong and P Schonfeld. An evolutionary model for simultaneously optimizing three-dimensional highway alignments. *Transportation Research Part B: Methodological,* 37(2):107-128, February 2003.

[KL10] Valentin R Koch and Yves Lucet. A note on: Spline technique for modeling roadway profile to minimize earthwork cost. *Journal of Industrial and Management Optimization,* 6(2):393-400, May 2010.

[KT06] Jon Kleinberg and Eva Tardos. *Algorithm Design.* Pearson Education, Inc., 1st. edition, 2006.

[LC01] Yusin Lee and Juey-Fu Cheng. Optimizing highway grades to minimize cost and maintain traffic speed. *Journal of Transportation Engineering,* 127(4):303-310, July/August 2001.

[LTL09] Yusin Lee, You-Ren Tsou, and Hsiao-Liang Liu. Optimization method for highway horizontal alignment design. *Journal of Transportation Engineering,* 135(4): 217-224, January 2009.

[Mor96] Ahmad A Moreb. Linear programming model for finding optimal roadway grades that minimize earthwork cost. *European Journal of Operational Research,* 93(1): 148-154, August 1996.

[Mor09] Ahmad A Moreb. Spline technique for modeling roadway profile to minimize earthwork cost. *Journal of Inustrual and Management Optimization,* 5(2):275-283, 2009.

[Tri87] D Trietsch. A family of methods for preliminary highway alignment. *Transportation Science,* 21(1):17-25, February 1987.

What is claimed is:

1. A computer-implemented method for optimizing a design for a vertical profile of a road, comprising:
   obtaining, in a special purpose computer, a ground surface profile;
   generating, in the special purpose computer, from the ground surface profile, an initial set of points of vertical intersection (PVIs) for the road, using a dynamic programming method;
   determining, in the special purpose computer, an earthwork cost and a hauling cost for building the road based on the PVIs; and
   reducing the earthwork cost and the hauling cost by modifying, in the special purpose computer, all of the following:
      an elevation of the PVIs;
      a horizontal position of the PVIs; and
      curve lengths of the vertical profile;
   wherein the reducing considers earthwork costs associated with a cross section of the road.

2. The method of claim 1, wherein the obtaining the ground surface profile comprises:
   filtering the ground surface profile using a Douglas-Peucker methodology to discard points that lie on one straight line.

3. The method of claim 1, wherein the initial set of PVIs are generated using a modified Segmented Least Squares (SLSQ) methodology.

4. The method of claim 1, wherein the determining of the optimized earthwork cost comprises:
   utilizing a linear program (LP) that addresses a use of multiple soil layers.

5. The method of claim 4, wherein the linear program optimizes the elevation of each PVI when ground offsets are not obtained.

6. The method of claim 4, wherein:
   the linear program computes the optimized earthwork cost based on earth volumes in subsections that comprise a region between two ground surface points along the ground surface profile.

7. The method of claim 6, wherein:
   the earth volumes in the subsections are computed linearly in the LP, if no ground profile offsets are provided;
   if, in a subsection, the vertical profile is above a ground surface, the subsection is a fill; and
   if, in a subsection, the vertical profile is not above the ground surface, the subsection is a cut.

8. The method of claim 6, wherein the earth volumes in the subsections are computed with a line-sweep method and integration between road assemblies and the ground surface profile, using ground profile offsets.

9. The method of claim 1, further comprising using a Stochastic Optimization (SO) methodology to update/select a horizontal PVI position, and a vertical curve length at each PVI, if a single ground profile is provided.

10. The method of claim 1, further comprising using a Stochastic Optimization (SO) methodology to update/select a horizontal PVI position, a PVI elevation, and a vertical curve length at each PVI.

11. The method of claim 1, wherein the reducing utilizes a continuous method.

12. An apparatus for optimizing a design for a vertical profile of a road in a computer system comprising:
   (a) a special purpose computer having a memory;
   (b) an application executing on the special purpose computer, wherein the application is configured to:

(i) obtain a ground surface profile;
(ii) generate, from the ground surface profile, an initial set of points of vertical intersection (PVIs) for the road, using a dynamic programming method;
(iii) determine an earthwork cost and a hauling cost for building the road based on the PVIs; and
(iv) reduce the earthwork cost and the hauling cost by modifying all of the following:
(A) an elevation of the PVIs;
(B) a horizontal position of the PVIs; and
(C) curve lengths of the vertical profile;
wherein the reducing considers earthwork costs associated with a cross section of the road.

13. The apparatus of claim 12, wherein the application is configured to obtain the ground surface profile by:
filtering the ground surface profile using a Douglas-Peucker methodology to discard points that lie on one straight line.

14. The apparatus of claim 12, wherein the initial set of PVIs are generated using a modified Segmented Least Squares (SLSQ) methodology.

15. The apparatus of claim 12, wherein the application is configured to determine the optimized earthwork cost by:
utilizing a linear program (LP) that addresses a use of multiple soil layers.

16. The apparatus of claim 15, wherein the linear program optimizes an elevation of each PVI when ground offsets are not obtained.

17. The apparatus of claim 15, wherein:
the linear program computes the optimized earthwork cost based on earth volumes in subsections that comprise a region between two ground surface points along the ground surface profile.

18. The apparatus of claim 17, wherein:
the earth volumes in the subsections are computed linearly in the LP, if no ground profile offsets are provided;
if, in a subsection, the vertical profile is above a ground surface, the subsection is a fill; and
if, in a subsection, the vertical profile is not above the ground surface, the subsection is a cut.

19. The apparatus of claim 17, wherein the earth volumes in the subsections are computed with a line-sweep method and integration between road assemblies and the ground surface profile, using ground profile offsets.

20. The apparatus of claim 12, wherein the application is further configured to use a Stochastic Optimization (SO) methodology to update/select a horizontal PVI position, and a vertical curve length at each PVI, if a single ground profile is provided.

21. The apparatus of claim 12, wherein the application is further configured to use a Stochastic Optimization (SO) methodology to update/select a horizontal PVI position, a PVI elevation, and a vertical curve length at each PVI.

22. The apparatus of claim 12, wherein the application reduces using a continuous method.

* * * * *